(12) United States Patent
Berens et al.

(10) Patent No.: US 10,243,577 B1
(45) Date of Patent: Mar. 26, 2019

(54) ANALOG-TO-DIGITAL CONVERTER (ADC) HAVING CALIBRATION

(71) Applicant: NXP USA, INC., Austin, TX (US)

(72) Inventors: Michael Todd Berens, Austin, TX (US); Khoi Mai, Austin, TX (US); James Robert Feddeler, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/943,173

(22) Filed: Apr. 2, 2018

(51) Int. Cl.
*H03M 1/20* (2006.01)
*H03M 1/10* (2006.01)

(52) U.S. Cl.
CPC .................................. *H03M 1/1047* (2013.01)

(58) Field of Classification Search
CPC ......... H03M 1/1047; H03M 1/08; H03M 1/46
USPC .................. 341/155, 161, 163, 144, 120
See application file for complete search history.

(56) References Cited

U.S. PATENT DOCUMENTS

| | | | |
|---|---|---|---|
| 6,891,487 B2 | 5/2005 | Leung et al. | |
| 7,764,262 B2 * | 7/2010 | Lee | G09G 3/3677 345/94 |
| 7,868,796 B2 | 1/2011 | Berens et al. | |
| 8,451,151 B2 | 5/2013 | Lin | |
| 9,319,059 B1 | 4/2016 | Sharma et al. | |
| 9,362,937 B1 | 6/2016 | Burgio et al. | |
| 9,425,814 B1 * | 8/2016 | Verma | H03M 7/165 |
| 9,432,041 B2 * | 8/2016 | Giacomini | H03M 1/0809 |
| 9,432,044 B1 | 8/2016 | Lee et al. | |

OTHER PUBLICATIONS

Ji-Yong Um et al., "A Digital-Domain Calibration of Split-Capacitor DAC for a Differential SAR ADC Without Additional Analog Circuits;" DOI: 10.1109/TCSI.2013.2252475; IEEE Transactions on Circuits and Systems; Nov. 2013; pp. 2845-2856.

Yanfei Chen et al., "Split Capacitor DAC Mismatch Calibration in Successive Approximation ADC;" DOI: 10.1109/CICC.2009. 5280859; Custom Integrated Circuits Conference, 2009. CICC '09, Sep. 13-16, 2009; pp. 279-282.

Zhe Li, et al., "Calibration for split capacitor DAC in SAR ADC," DOI: 10.1109/ASICON.2013.6811966; 2013 IEEE 10th International Conference on ASIC; Oct. 28-31, 2013; 4 pages.

\* cited by examiner

*Primary Examiner* — Peguy Jean Pierre

(57) ABSTRACT

An analog-to-digital converter (ADC) includes a split-capacitor digital-to-analog converter (DAC) having a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs, and coupled to receive an analog input voltage, a high reference voltage, and a low reference voltage, and to provide an output voltage. The ADC includes a comparator coupled to receive the output voltage, successive-approximation-register (SAR) circuitry coupled to the comparator and providing an uncalibrated digital value corresponding to an uncalibrated digital representation of the input voltage, and calibration circuitry configured to apply one or more calibration values to the uncalibrated digital value to obtain a calibrated digital value corresponding to a calibrated digital.

20 Claims, 5 Drawing Sheets

US 10,243,577 B1

ANALOG-TO-DIGITAL CONVERTER (ADC) HAVING CALIBRATION

BACKGROUND

Field

This disclosure relates generally to data conversion circuits, and more specifically, to Analog-to-Digital Converters (ADC) having calibration.

Related Art

An ADC converts an analog input to a digital output. One type of ADC circuit is a Successive Approximation Register (SAR) ADC. However, due to such factors as device mismatch, mismatch of the scaling elements, and parasitic elements, accuracy of a high resolution SAR ADC is compromised. In order to obtain accuracy at higher resolutions, a calibration method is desired to improve differential and integral non-linearity of the ADC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The resolution of SAR ADCs is usually limited by the matching of elements in the ADC's digital-to-analog conversion (DAC) sub-block. In such type of SAR ADCs, a split-capacitor DAC may be used to reduce the number of matching elements required. Also, split-capacitor DACs significantly decrease the area requirement and increase speed of the ADC. However, this type of split-capacitor DAC uses one or more scaling capacitors which are non-unit sized. These scaling capacitors reduce device matching and introduce unwanted parasitics. Also, thermometer encoding can be used to reduce switching currents which reduces power consumption and increases settling speed. However, full thermometer encoding is usually not feasible beyond 4-5 bits due to the large amount of logic needed in the critical speed path.

Therefore, in one aspect of the present invention, a split capacitor DAC uses a combination of thermometer encoding and binary encoding for the Most Significant Bits (MSBs) sub-DAC. In order to achieve better than 11-12 bits of accuracy for the DAC, self-calibration is also used. In one embodiment, the self-calibration includes measuring each capacitor element or group of capacitor elements and using these measurement results to compute calibration values for each ADC output code.

Figure 1:
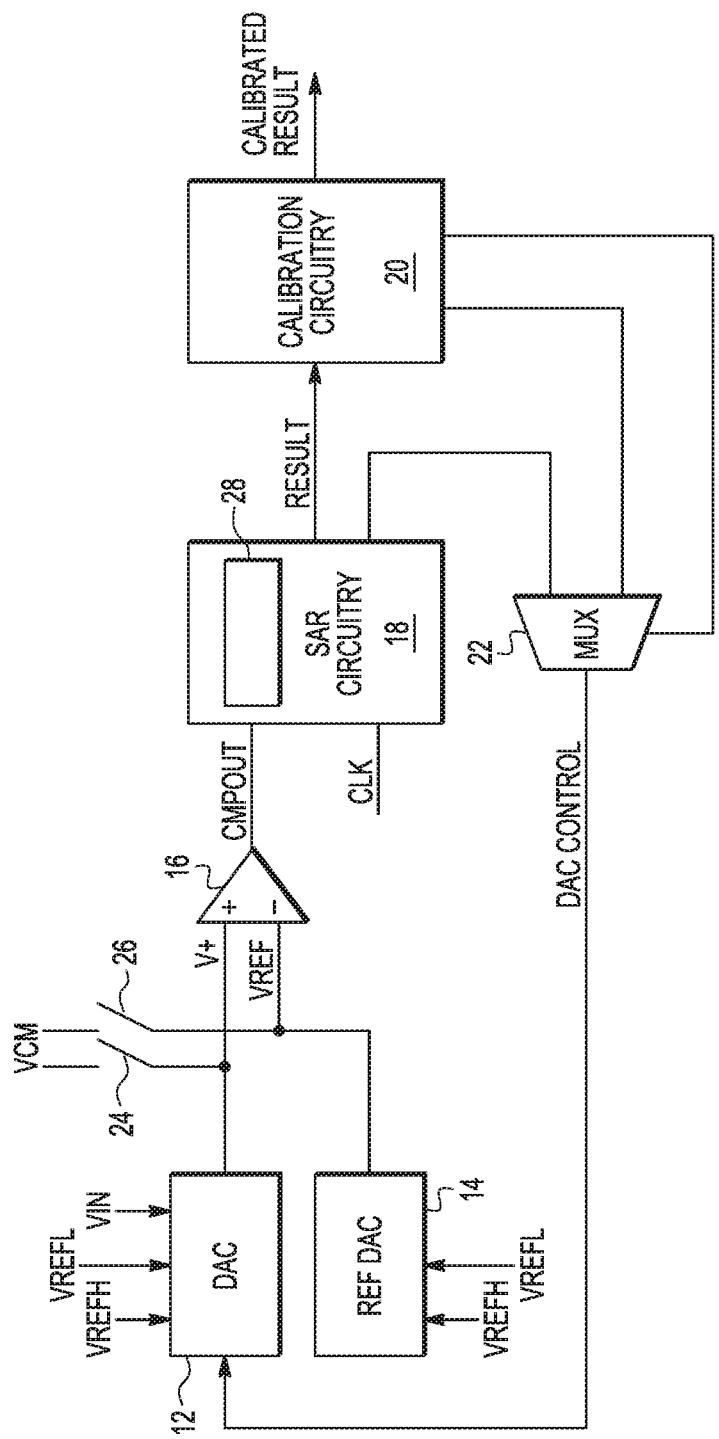
FIG. 1 illustrates, in block diagram form, a SAR ADC in accordance with one embodiment of the present invention.

FIG. 1 illustrates a SAR ADC 10 in accordance with one embodiment of the present invention. SAR ADC 10 includes a DAC 12, reference DAC (REF DAC) 14, a comparator 16, SAR circuitry 18, calibration circuitry 20, and a multiplexor (MUX) 22. DAC 12 is coupled to supply voltage terminals Vrefh, Vrefl, and Vin, and provides an output voltage (Vout or V+) to a non-inverting input, V+, of comparator 16. REF DAC 14 is also coupled to Vrefh and Vrefl and provides a reference voltage, Vref, to an inverting input of comparator 16. The non-inverting input of comparator 16 is also coupled to a common mode voltage, VCM, via a switch 24, and the inverting input of comparator 16 is coupled to VCM via a switch 26. An output of comparator 16, cmpout, is provided to SAR circuitry 18, which includes storage circuitry 28 to store a SAR result, and this uncalibrated result, RESULT, is provided to calibration circuitry 20. Calibration circuitry 20 calibrates the result and provides a CALIBRATED RESULT for use by other circuitry. SAR circuitry 28 and calibration circuitry 20 each provides a set of control signals to MUX 22, which, depending on whether a data conversion or calibration is occurring, outputs these control signals as DAC control signals to DAC 12. Calibration circuitry 20 provides a select signal to MUX 22 which selects between the output of the SAR circuitry 20 and calibration circuitry 20.

In operation, REF DAC 14 provides a reference voltage, Vref. However, in alternate embodiments, Vref may be provided by other sources. In the illustrated embodiment, DAC 12 uses a charge redistribution array for data conversion from digital to analog. During a conversion (in which DAC 12 operates normally to convert a digital value to an analog value), input voltage Vin is sampled onto DAC 12. Then, during a comparison phase, the DAC capacitors (as will be seen in FIG. 2) are controlled to successively approximate the input voltage Vin using the output of comparator 16 to make decisions on how to switch the capacitors of DAC 12. At each step of the approximation, the output of comparator 16 results in a bit being stored in storage circuitry 28. The resulting digital word, output as RESULT, is the uncalibrated digital representation of the analog input Vin.

Figure 2:
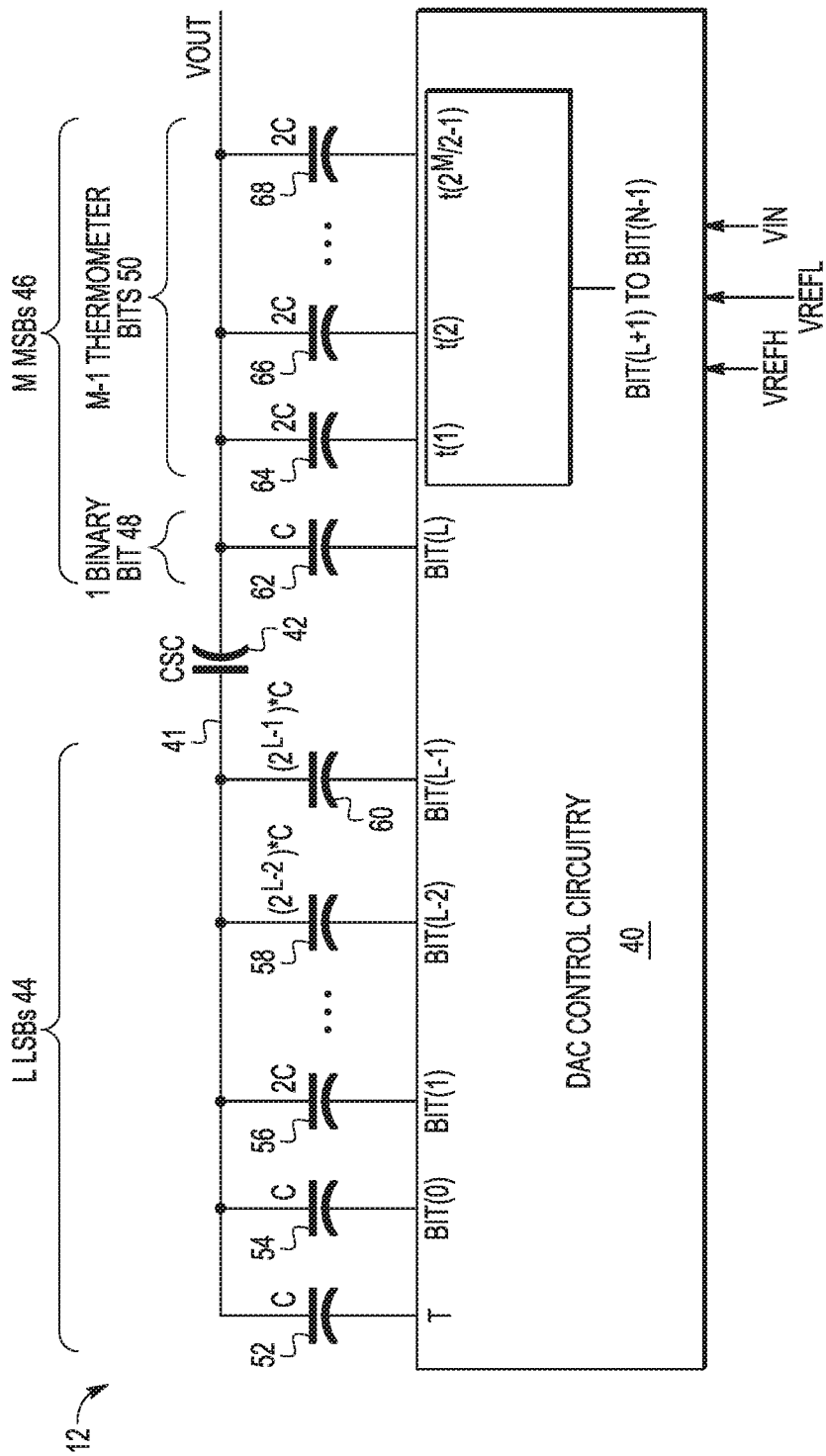
FIG. 2 illustrates, in partial block diagram and partial schematic form, a DAC of the SAR ADC of FIG. 1 in accordance with one embodiment of the present invention.

FIG. 2 illustrates, in partial schematic and partial block diagram form, DAC 12 in further detail, in accordance with one embodiment of the present invention. DAC 12 is an N bit split capacitor DAC which is split into two sub-DACs, with the sub-DACs coupled to each other via a scaling capacitor, Csc 42. DAC 12 includes L least significant bits (LSBs) 44 represented by one side of Csc 42, and M MSBs 46 represented by the other side of Csc 42, such that N=M+L. The LSBs are represented by L binary weighted capacitors. The M MSBs are represented by a combination of one or more binary encoded bits and one or more thermometer encoded bits. In the illustrated embodiment of FIG. 2, M MSBs 46 includes 1 binary encoded bit and M−1 thermometer encoded bits.

DAC 12 includes capacitors 52, 54, 56, 58, 60, each of which has a first terminal (i.e. plate) coupled to a circuit node 41 at a first terminal of Csc 42 and a second terminal (i.e. plate) coupled to DAC control circuitry 40. Capacitor 52 is a termination capacitor having a unit capacitance of C. Capacitors 54, 56, . . . , 58, 60 correspond to bits 0 to (L−1), and each has a binary weighted capacitance, starting with capacitor 54 having a capacitance of C, capacitor 56 having a capacitance of 2C, to capacitor 58 which has a capacitance of $(2^{L-2})*C$, to capacitor 60 which has a capacitance of $(2^{L-1})*C$. The capacitors corresponding to LSBs 44 may be referred to as the LSBs sub-DAC of DAC 12. In alternate embodiments, DAC 12 may include any number of LSBs sub-DACs, each coupled with a corresponding scaling capacitor. For example, LSBs 44 may divided into two LSBs sub-DACs coupled with another scaling capacitor. In this case, DAC 12 would include 3 sub-DACs rather than 2 sub-DACs as illustrated. In other embodiments, the LSB sub-DACs may also use thermometer encoding or a combination of binary and thermometer encoding.

MSBs 46 include capacitors 62, 64, 66, ... 68, which may be referred to as the MSBs sub-DAC. Capacitors 62, 64, 66, 68 each have a first terminal (i.e. plate) coupled to Vout and a second terminal (i.e. plate) coupled to DAC control circuitry 40. Capacitor 62 corresponds to the 1 binary encoded bit and therefore has a unit capacitance of C. Capacitors 64, 66, ..., 68 correspond to the M−1 thermometer encoded bits, referred to as "t". Thermometer encoding refers to asserting one bit for each decimal value of bits. For example, to encode 3 binary bits (in which binary bits are indicated by a "0b" preceding the bit values), 7 thermometer bits are required in which 0b000=a t value of "0000000", 0b001=a t value of "0000001", 0b010=a t value of "0000011", 0b011=a t value of "0000111", 0b100=a t value of "0001111", etc. Therefore, to encode M binary bits, $2^M-1$ thermometer bits are required. Thus to encode "M−1" binary bits, $2^{M-1}-1$ bits are required, which is equivalent to $2^M/2-1$. In DAC 12, each of capacitors 64, 66, ..., and 68 have a capacitance of 2C, in which one "2C" capacitor corresponds to each of t(1) to $t(2^M/2-1)$, respectively. Note that each thermometer 2C capacitor can be referred to as a capacitor group. Bits t(1) to $t(2^M/2-1)$ correspond to the thermometer encoding of the M−1 MSBs, bit(L+1) to Bit(N−1).

DAC control circuitry 40 provide switches to Vin, Vrefh, and Vrefl, which are each applied, as needed, based on the current operation, e.g. sample or comparison phases of a conversion or calibration operation. Operation of DAC 12 with respect to a normal conversion operation is known in the art and will not be discussed in full detail. In summary, Vin is first sampled during a sample phase. During the sample phase, each of V+ and Vref are precharged to VCM, and then Vin is sampled by setting the bottom (i.e. second) plates of the capacitors to Vin. Note that Vrefh is greater than Vrefl, and setting the bottom plate of a capacitor to Vrefh may be referred to as turning on a capacitor and setting the bottom plate to Vrefl may be referred to as turning off the capacitor.

Following the sample phase, a comparison phase is initiated in which each result bit value is determined, in turn, by comparator 16 and SAR circuitry 18. Note that the comparison phase may also be referred to as the approximation phase. For example, the comparison (or approximation) phase begins with setting the second (i.e. bottom) plate of the largest MSB capacitor to Vrefh. The appropriate control signals to do so may be provided via DAC control via MUX 22 from SAR circuitry 18. If this pushes V+ greater than Vref, cmpout=1 and the stored bit in storage circuitry 28 is a 0. In this case, the bottom plate of that capacitor is returned to Vrefl. The appropriate control signals to do so may be provided via DAC control via MUX 22 from SAR circuitry 18. If this does not push V+ greater than Vref, cmpout=0 and a 1 is stored in storage circuitry 28. In this case, the bottom plate of that capacitor is maintained at Vrefh. The next MSB capacitors (MSB-1, MSB-2, etc.) and the LSB capacitors are then each processed in a similar fashion to determine all digital output bits of RESULT.

In the case of the binary/thermometer encoded MSBs of FIG. 2, in the comparison phase, a comparison is performed for each MSB bit, bit(L) to Bit(N−1). The comparison phase begins with setting a number of thermometer bits to 1 (which couples the bottom, i.e. second, plates of the thermometer capacitors) to Vrefh. The number of set thermometer capacitors corresponds to the largest MSB capacitance which is half of the total capacitance in the MSB sub-DAC. The comparison is performed, as described above, and if V+ is greater than Vref, cmpout=1 and a 0 is stored in storage circuitry 28. In this case, the number of set capacitors is reduced by turning off half the thermometer capacitors. If V+ is not greater than Vref, a 1 is stored in storage circuitry 28. In this case, the number of set capacitors is increased by turning on half as many additional capacitors. Note that each time a number of set capacitors is increased, the required number of thermometer "2C" capacitors is turned on (without having to turn any capacitors off). This saves power as compared to binary weighted capacitors in which the larger weighted capacitor must be turned off and then the lesser weighted capacitor must be turned on. Therefore, using thermometer encoding or partial thermometer encoding for the MSBs reduces power as compared to using binary encoding for all the MSBs.

The last comparison for the MSBs corresponds to the binary bit, bit(L). This last comparison determines whether to keep capacitor 62, weighted as C, coupled to Vrefh or return capacitor 62 back to Vrefl. If there are multiple binary weighted MSBs, then for each binary MSB bit, the process described above with respect to a fully binary weighted DAC is performed. The process described above with respect to a fully binary weighted DAC is also performed for each LSB bit. This completes the comparison phase and completes the data conversion.

The result stored in storage circuitry 28 is provided by SAR circuitry 18 as RESULT to calibration circuitry 20 which provides the CALIBRATED RESULT. Based on the conversion results for bits(N−1:L), a particular calibration value is subtracted from the result to provide the calibrated result. These calibration values, in one embodiment, can be determined beforehand and stored within calibration circuitry 20 for use with each conversion. A calibration value, res(L, $1:2^M/2-1$), can be determined and stored for each of Bit(L) and t(1) to $t(2^M/2-1)$. In one embodiment, a calibration value res(L) is obtained by first comparing the Bit(L) capacitor to the sum of Bit(L−1) to Bit(0) plus the termination capacitor, T. From this point, each of the "2C" capacitor groups is individually compared to the sum of Bit(L) to Bit(0) plus the termination capacitor to obtain res(1) through $res(2^M/2-1)$. These calibration values, res(L) and res(1) through $res(2^M/2-1)$, can then be applied to conversion result, RESULT, to obtain the calibrated result.

Figure 3:
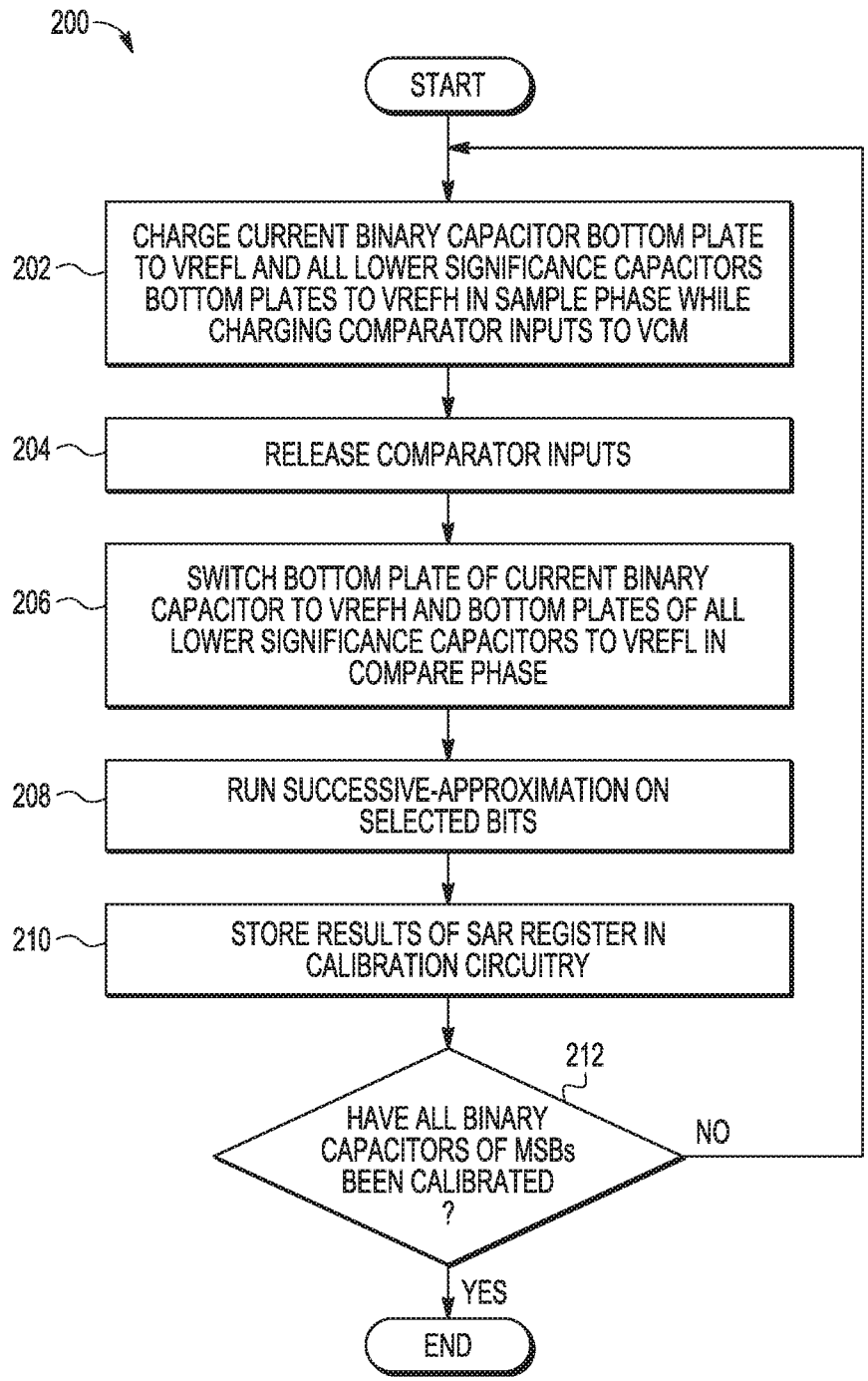
FIG. 3 illustrates, in flow diagram form, a method of determining calibration values for binary encoded bits of the Most Significant Bits (MSBs) sub-DAC, in accordance with one embodiment of the present invention.
Figure 4:
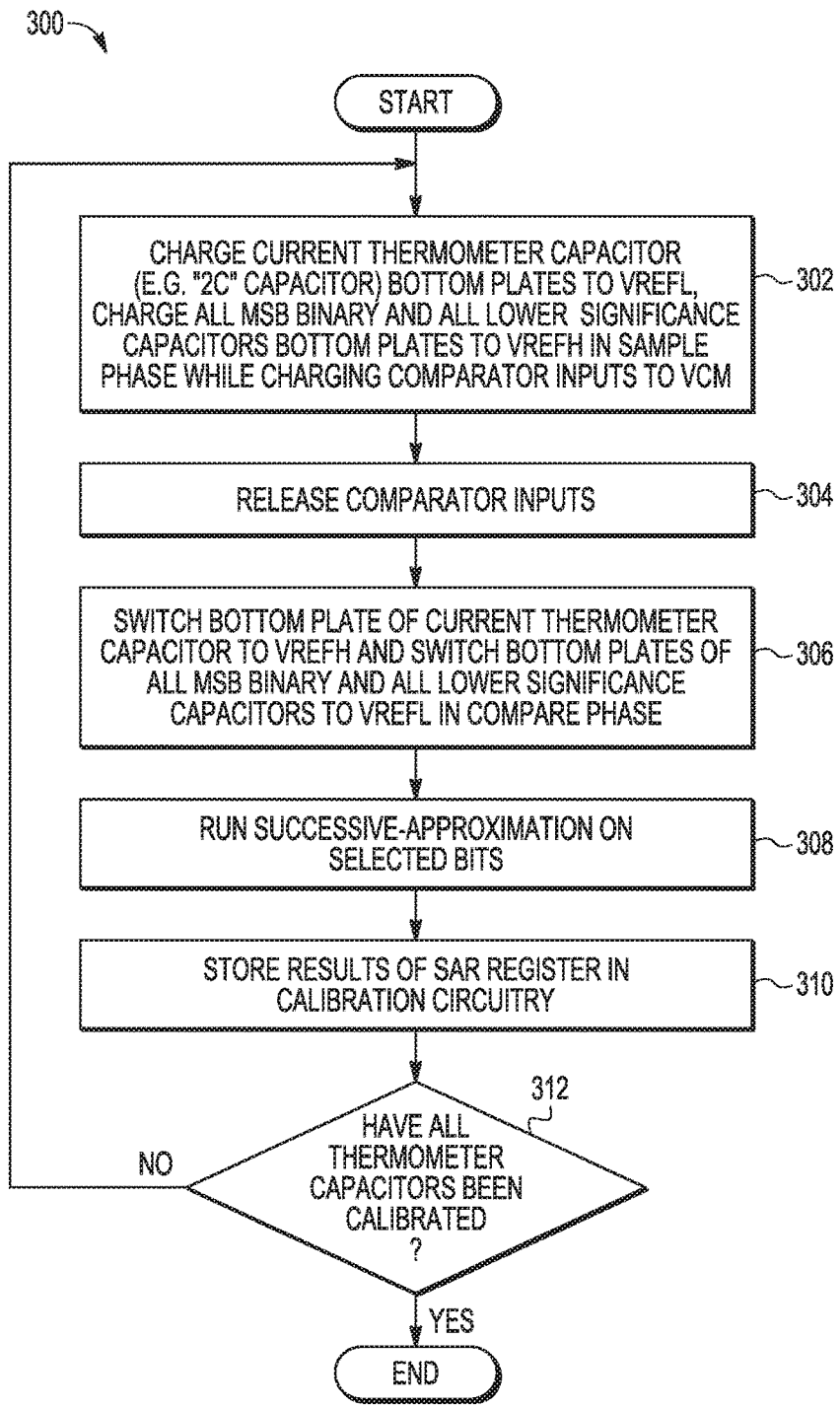
FIG. 4 illustrates, in flow diagram form, a method of determining calibration values for thermometer encoded bits of the MSBs sub-DAC, in accordance with one embodiment of the present invention.

FIGS. 3 and 4 provide methods for obtaining the calibration values corresponding to the binary capacitors and the thermometer capacitors, respectively. FIG. 3 illustrates, in flow diagram form, a method 200 for determining a calibration value for the binary capacitors of the MSBs. For each calibration method, control values can be sent as DAC control to DAC 12 via MUX 22 from calibration circuitry 20 in order to couple the capacitors appropriately to Vrefh or Vrefl. During calibration, calibration circuitry 20 may send a control signal to MUX 22 such that the input from calibration circuitry 20 is selected as providing DAC control to DAC 12.

Referring first to FIGS. 2 and 3, method 200 determines res(L) for Bit(L) which corresponds to the one (and only) binary capacitor of M MSBs 46. In method 200, each binary capacitor of the MSBs is selected and processed in turn. Method 200 begins with block 202 in which, in the sample phase, while charging the inputs of comparator 16 to Vcm, the bottom plate (i.e. second plate) of the current binary capacitor is charged to Vrefl, and the bottom plates (i.e. second plates) of all lower significance capacitors are charged to Vrefh. In the embodiment of FIG. 2, the current binary capacitor refers to capacitor 62 for Bit(L). The inputs of comparator 16 are charged to Vcm via switches 24 and 26. Method 200 then proceeds to block 204 in which the comparator inputs are released (switches 24 and 26 are opened).

Method 200 then proceeds to block 206 in which the bottom plate of the current binary capacitor is switched to Vrefh, and the bottom plates of all the lower significance capacitors are switched to Vrefl for the comparison phase. In block 208, the successive-approximation is run on selected bits so as to approximate the difference between Bit(L) and the sum of Bit(L−1) to Bit(0) plus the termination capacitor, T. Note that the successive-approximation need not be run on all bits because this difference is a small value, and only a subset of the bits may provide sufficient accuracy. In block 210, the results of the successive-approximation are stored in storage circuitry of calibration circuitry 20. Next, at decision diamond 212, it is determined if all binary capacitors of the MSBs have been calibrated. If so, method 200 ends, and if not, a next binary capacitor is selected as the current binary capacitor and method 200 is repeated. Referring to the example of FIG. 2, at the end of method 200, the value res(L) is stored in calibration circuitry 20.

FIG. 4 illustrates, in flow diagram form, a method 300 for determining a calibration value for the thermometer capacitors of the MSBs. Referring to FIG. 2, method 300 determines res(1) to res($2^M/2-1$) which correspond to t(1) to t($2^M/2-1$). In method 300, each thermometer capacitor of the MSBs is selected and processed in turn. Method 300 begins with block 302 in which, in the sample phase, while charging the inputs of comparator 16 to Vcm, the bottom plates (i.e. second plates) of the current thermometer 2C capacitor is charged to Vrefl, and the bottom plates of the MSB binary capacitors and all lower significance capacitors are charged to Vrefh. In the embodiment of FIG. 2, the first time through method 300, the current thermometer capacitor refers to capacitor 64 for t(1), with a capacitance of 2C. The inputs of comparator 16 are charged to Vcm via switches 24 and 26. Method 300 then proceeds to block 304 in which the comparator inputs are released (switches 24 and 26 are opened).

Method 300 then proceeds to block 306 in which the bottom plate of the current thermometer 2C capacitor is switched to Vrefh, and the bottom plates of all binary MSB capacitors and all lower significance capacitors are switched to Vrefl for the comparison phase. In block 308, the successive-approximation is run on selected bits so as to approximate the difference between the current 2C capacitor (t(1) in the case of the first time through method 300) and the sum of Bit(L) to Bit(0) plus the termination capacitor, T. Note that the successive-approximation need not be run on all bits because this difference is a small value, and only a subset of the bits may provide sufficient accuracy. In block 310, the results of the successive-approximation are stored in storage circuitry of calibration circuitry 20. Next, at decision diamond 312, it is determined if all thermometer 2C capacitors of the MSBs have been calibrated. If so, method 300 ends, and if not, a next thermometer 2C capacitor is selected as the current thermometer capacitor and method 300 is repeated. Referring to the example of FIG. 2, at the end of method 300, the values res(1) through res($2^M/2-1$) are stored in calibration circuitry 20.

The calibration value described in reference to FIGS. 3 and 4 can be stored in calibration circuitry 20 prior to operation of ADC 10. Then, during operation, each time a conversion result, RESULT, is obtained, calibration circuitry 20 can use these values to determine the CALIBRATED RESULT. In one embodiment, the calibration values are applied to the conversion results in the following manner: If the result of Bits(N−1:L)=0, no value is subtracted from the result, if the result of Bits(N−1:L)=1, subtract res(L) from the result, if the result of Bits(N−1:L)=2, subtract res(L)+res(1) from the result, if the result of Bits(N−1:L)=3, subtract 2*res(L)+res(1) from the result, if the result of Bits (N−1:L)=4, subtract 2*res(L)+res(1)+res(2) from the result, if the result of Bits(N−1:L)=5, subtract 3*res(L)+res(1)+res(2) from the result, if the result of Bits(N−1:L)=6, subtract 3*res(L)+res(1)+res(2)+res(3) from the result, . . . if the result of bits(N−1:L)=$2^M-2$, subtract ($2^M/2-1$)*res(L)+SUM(res(1) . . . res($2^M/2-1$)) from the result, and if the result of bits(N−1:L)=$2^M-1$, subtract ($2^M/2$)*res(L)+SUM (res(1) . . . res($2^M/2-1$)) from the result.

Note that the above application of the calibration values can be generalized as follows: If the conversion results of Bits(N−1:L)=R, then subtract the calibration adjustment value, calvalue(R), from the ADC result.

$$calvalue(R) = \text{int}\left(\frac{R+1}{2}\right) * res(L) + \sum_{x=1}^{int(\frac{R}{2})} res(x)$$

In one embodiment, rather than storing each calibration value in calibration storage circuitry 20, res(L) and each of the summed values may be stored instead. This requires storing $2^M/2$ total values and the calibration can be applied in two steps (rather than performing the full summation after each result). That is, once the MSB bit conversions are complete, the value of these bits can be sent to calibration circuitry 20 and the calibration value can be computed over the next several clock cycles (while the LSBs are converting). In this manner, the CALIBRATED RESULT can be computed one clock cycle after determining the ADC RESULT.

In alternate embodiments, different combinations or summations of calibration values may be stored and the calculations performed in greater or fewer steps. Also, the calibration values or combination of calibration values can be stored in storage circuitry located outside of calibration circuitry 20.

Figure 5:
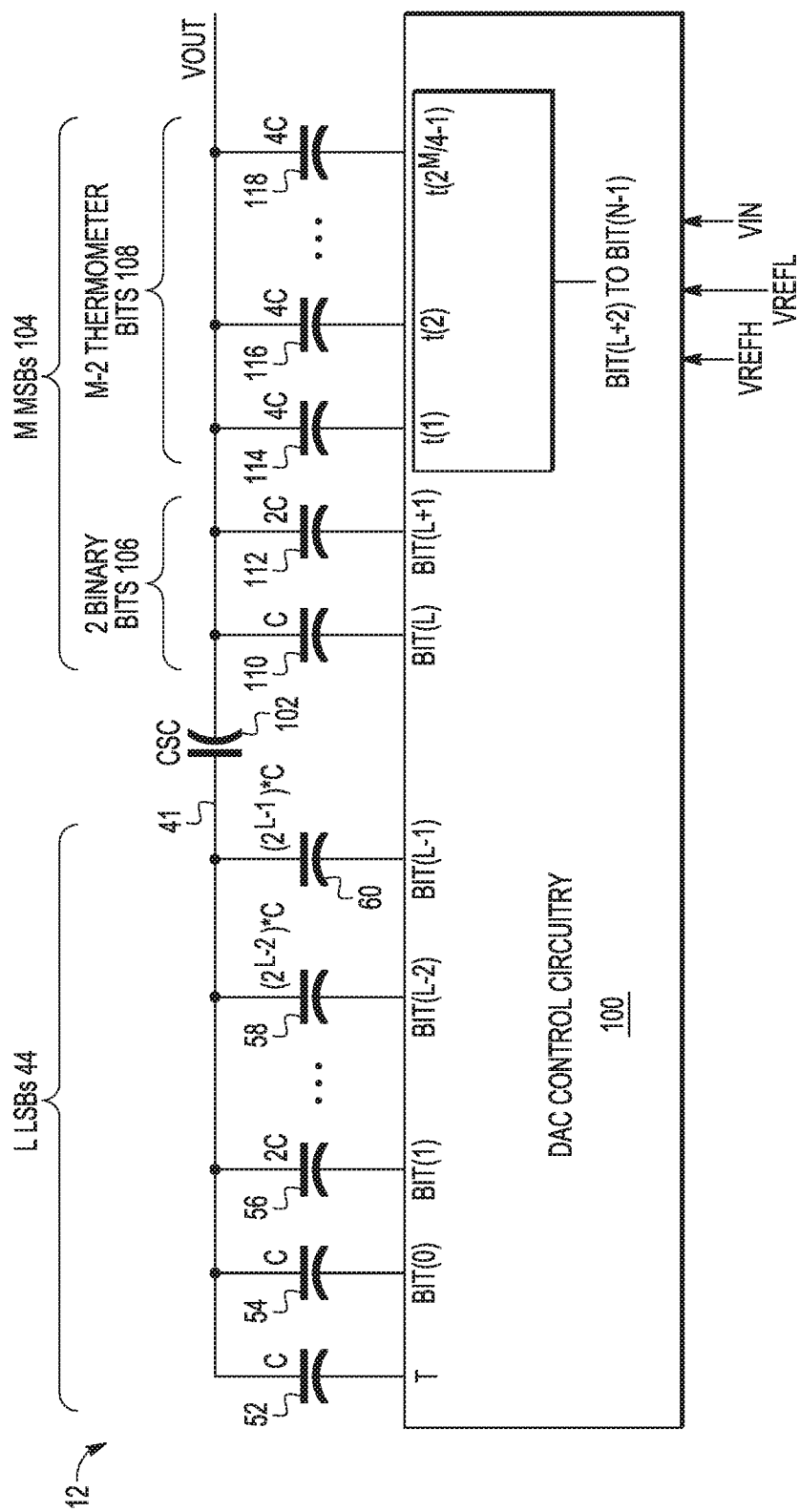
FIG. 5 illustrates, in partial block diagram and partial schematic form, a DAC of the SAR ADC of FIG. 1 in accordance with one embodiment of the present invention.

Alternate embodiments may include any number and combination of binary and thermometer bits with the MSB sub-DAC. FIG. 5 illustrates, in partial schematic and partial block diagram form, DAC 12 in an alternate embodiment in which like numbers indicate like elements. As in FIG. 2, DAC 12 is an N bit split capacitor DAC which is split into two sub-DACs, with the sub-DACs coupled to each other via a scaling capacitor, Csc 102. DAC 12 includes L least significant bits (LSBs) 44 represented by one side of Csc 102. DAC 12 also includes M MSBs 104 represented by the other side of Csc 102, such that N=M+L. The LSBs are represented by L binary weighted capacitors. However, unlike DAC 12 of FIG. 2, M MSBs 104 of FIG. 5 includes 2 binary encoded bits and M−2 thermometer encoded bits. That is, as compared to DAC 12 of FIG. 2, DAC 12 of FIG. 5 includes 1 additional binary encoded bit, Bit(L+1), and therefore includes $2^M/4-1$ thermometer encoded bits, t(1)–($2^M/4-1$). Binary Bit(L) has a unit capacitance C, and binary Bit(L+1) has a capacitance of 2C. Each thermometer capacitor has a capacitance of 4C.

Referring to the MSBs sub-DAC of DAC 12 in FIG. 5, capacitors 110, 112, 114, 116, and 118 each have a first terminal (i.e. plate) coupled to Vout and a second terminal (i.e. plate) coupled to DAC control circuitry 100. Capacitors 110 and 112 corresponds to the 2 binary encoded bits and therefore have capacitances of C and 2C, respectively. Capacitors 114, 116, . . . , and 118 correspond to the M−2 thermometer encoded bits, again referred to as "t". Each of capacitors 114, 116, . . . , and 118 have a capacitance of 4C, in which one "4C" capacitor corresponds to each of t(1) to t($2^M/4-1$), respectively. Bits t(1) to t($2^M/4-1$) correspond to the thermometer encoding of the M−2 MSBs, bit(L+2) to Bit(N−1).

DAC control circuitry 100 provide switches to Vin, Vrefh, and Vrefl, which are each applied, as needed, based on the current operation, e.g. sample or compare phases of a conversion or calibration. Operation of DAC 12 with respect to a normal conversion operation is known in the art and will not be discussed in full detail. Note that the descriptions provided above with respect to the normal operation of binary MSB bits and thermometer MSB bits applies to the DAC of FIG. 5.

Still referring to FIG. 5, after a conversion is performed, the result stored in storage circuitry 28 is provided by SAR circuitry 18 as RESULT to calibration circuitry 20 which provides the CALIBRATED RESULT. Based on the conversion results for bits(N−1:L), a particular calibration value is subtracted from the result to provide the calibrated result. These calibration values, in one embodiment, can be determined beforehand and stored within calibration circuitry 20 for use with each conversion. A calibration value, res(L, L+1, 1:$2^M/4-1$), can be determined and stored for each of Bit(L), Bit(L+1), and t(1) to t($2^M/4-1$). In one embodiment, a calibration value res(L) is obtained by first comparing the Bit(L) capacitor, C, to the sum of Bit(L−1) to Bit(0) plus the termination capacitor, T. Next, a calibration value res(L+1) is obtained by comparing the Bit(L+1) capacitor, 2C, to the sum of Bit(L) to Bit(0) plus the termination capacitor, T. From this point, each of the "4C" capacitors is individually compared to the sum of Bit(L+1) to Bit(0) plus the termination capacitor to obtain res(1) through res($2^M/4-1$). These calibration values, res(L), res(L+1), and res(1) through res($2^M/4-1$), can then be applied to the conversion result, RESULT, to obtain the calibrated result.

Calibration values for the DAC of FIG. 5 can be determined as described in reference to FIGS. 3 and 4. In this case, method 200 of FIG. 3 would be performed twice for the 2 binary capacitors and method 300 would be performed $2^M/4-1$ times for the $2^M/4-1$ thermometer 4C capacitors. Again, these values, or combinations or summations of these values, can be stored in storage circuitry within calibration circuitry 20 or elsewhere. During operation of ADC 10 using DAC 12 of FIG. 5, each time a conversion result, RESULT, is obtained, calibration circuitry 20 can use the stored calibration values to determine the CALIBRATED RESULT. In one embodiment, the calibration values are applied to the conversion results in the following manner: If the result of bits(N−1:L)=0, no value is subtracted from the result, if the result of bits(N−1:L)=1, subtract res(L) from the result, if the result of bits(N−1:L)=2, subtract res(L)+ res(L+1) from the result, if the result of bits(N−1:L)=3, subtract 2*res(L)+res(L+1) from the result, if the result of bits(N−1:L)=4, subtract 2*res(L)+res(L+1)+res(1) from the result, if the result of bits(N−1:L)=5, subtract 3*res(L)+res(L+1)+res(1) from the result, if the result of bits(N−1:L)=6, subtract 3*res(L)+2*res(L+1)+res(1) from the result, if the result of bits(N−1:L)=7, subtract 4*res(L)+2*res(L+1)+res(1) from the result, if the result of bits(N−1:L)=8, subtract 4*res(L)+2*res(L+1)+res(1)+res(2) from the result, if the result of bits(N−1:L)=9, subtract 5*res(L)+2*res(L+1)+res(1)+res(2) from the result, if the result of bits(N−1:L)=10, subtract 5*res(L)+3*res(L+1)+res(1)+res(2) from the result, . . . , if the result of bits(N−1:L)=$2^M-2$, subtract ($2^M/2-1$)*res(L)+($2^M/4$)*res(L+1)+SUM(res(1) . . . res($2^M/4-1$)) from the result, and if the result of bits(N−1:L)=$2^M-1$, subtract ($2^M/2$)*res(L)+($2^M/4$)*res(L+1)+SUM(res(1) . . . res($2^M/4-1$)) from the result.

Note that the above application of the calibration values can be generalized as follows: If the conversion results of Bits(N−1:L)=R, then subtract the following calibration adjustment value, calvalue(R), from the ADC result.

$$calvalue(R) = int\left(\frac{R+1}{2}\right)*res(L) + int\left(\frac{R+2}{4}\right)*res(L+1) + \sum_{x=1}^{int(\frac{R}{4})} res(x)$$

A generic formula for the calibration adjustment value may be represented as:

$$calvalue(R) = \sum_{b=1}^{B} int\left(\frac{R+2^{b-1}}{2^b}\right)*res(L+b-1) + \sum_{x=1}^{int(\frac{R}{2^B})} res(x)$$

In the above equation, R is the MSB portion of the conversion result in decimal. This value will range from 0 to $2^{M-1}$ wherein M is the number of MSBs DAC bits (binary encoded plus thermometer encoded bits). B is the number of binary encoded bits. The values res(L+b−1) are the binary encoded capacitor calibration results. These will range from L to L+(B−1) (one result for each binary bin). The values res(x) are the thermometer encoded capacitor calibration results. These will range from 1 to $2^M/2^B-1$ (in other words, if T=M−B is the number of thermometer encoded bits, x can range from 1 to $2^T-1$).

By using a combination of binary encoded and thermometer encoded bits in the MSB sub-DAC, lower power may be consumed in the DAC during normal operation as compared to a full binary encoding. Furthermore, reduced area may be achieved as compared to full thermometer encoding. Also, the combination may allow for higher speed during normal operation with less reference ringing which allows for faster DAC settling. The application of the calibration values discussed above may allow for consistent dI/dt for all calibration steps which reduces or eliminates calibration errors, resulting in improved linearity. While the calibration described above may require a slightly longer calibration time than currently used systems, the calibration time does not affect the ADC sample rate because the calibration can be done prior to any conversions.

Although ADC 10 and the discussions herein have been described with respect to a single-ended ADC, the discussions herein also apply to differential ADCs. For example, for embodiments using a differential ADC, the circuitry of FIGS. 2 and 5 may be used to provide the inputs for both the positive and negative inputs of differential comparator 16. The methods of FIGS. 3 and 4 would be therefore be used for both sides of a differential ADC. Also, a second DAC similar to DAC 12 would be used in place of REF DAC 14. This second DAC would receive a second input voltage. Therefore, note that REF DAC 14 may not be used in some embodiments.

Therefore, by now it can be understood how the problems in device matching for a split-capacitor SAR ADC can be addressed through the use of combined binary/thermometer encodings for the MSBs as well as a self-calibration method. With the calibration methods described above, a calibration value can be used after each conversion to quickly provide a calibrated result, while not compromising the normal operating speed of the ADC. In one aspect, the self-calibration includes measuring each capacitor or group of capacitors and using these measurement results to compute calibration values for each ADC output code.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In one embodiment, the illustrated elements of system 10 are circuitry located on a single integrated circuit or within a same device. Alternatively, system 10 may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although a single-ended ADC is illustrated, the above calibration can also be applied to a differential ADC. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In an embodiment, an analog-to-digital converter (ADC) includes a split-capacitor digital-to-analog converter (DAC) having a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs, and coupled to receive an analog input voltage, a high reference voltage, and a low reference voltage, and to provide an output voltage, wherein the high reference voltage is greater than the low reference voltage. The ADC also includes a comparator having a first input coupled to receive the output voltage of the DAC, a second input, and a comparison output based on a difference in voltage between the first input and the second input; successive-approximation-register (SAR) circuitry having an input coupled to receive the comparison output, and an output to provide an uncalibrated digital value corresponding to an uncalibrated digital representation of the input voltage; and calibration circuitry coupled to receive the uncalibrated digital value and configured to apply one or more calibration values to the uncalibrated digital value to obtain a calibrated digital value corresponding to a calibrated digital representation of the input voltage, wherein the calibration values are selected based on the value of MSBs of the uncalibrated digital value. In one aspect of this embodiment, the calibration circuitry is configured to obtain a calibration value corresponding to each binary capacitor and each thermometer capacitor of the MSBs sub-DAC. In a further aspect, the calibration circuitry is configured to obtain a calibration value, for each thermometer capacitor of the one or more thermometers capacitors, by individually comparing a capacitance of the thermometer capacitor to a sum of all capacitances of all binary capacitors and all capacitors of the LSBs sub-DAC and the termination capacitor. In yet a further aspect, the calibration circuitry is configured to obtain a corresponding calibration value, for each binary capacitor, by comparing a capacitance of the binary capacitor to a sum of capacitances of all capacitors of lesser significant bits than the binary capacitor, including all capacitors of the LSBs sub-DAC, and the termination capacitor. In yet a further aspect, the calibration circuitry is configured to apply the one or more calibration values to the uncalibrated digital value when the value of the MSBs of the uncalibrated digital value is greater than 0. In yet a further aspect, the calibration circuitry is configured to apply the one or more calibration values to the uncalibrated digital value by subtracting at least N times the calibration value corresponding to the least significant binary capacitor of the one or more binary capacitors when the value of the MSBs of the uncalibrated digital value is greater than 0, wherein N is an integer greater than 0. In yet a further aspect, the calibration circuitry is configured to apply the one or more calibration values to the uncalibrated digital value by also subtracting the calibration value corresponding to the least significant thermometer capacitor of the one or more thermometer capacitors when the value of the MSBs of the uncalibrated signal is greater than one less than 2 raised to a number of binary capacitors of the one or more binary capacitors. In another aspect, the calibration circuitry is configured to store each calibration value. In yet another aspect, the calibration circuitry is configured to store sums of selected calibration values. In another aspect of the embodiment, the calibration circuitry is configured to, during calibration, for each thermometer capacitor: during a sample phase, provide DAC control signals to the DAC to charge the thermometer capacitor by coupling the thermometer capacitor to the low reference voltage and coupling all lower significant capacitors the high reference voltage; and during a comparison phase, provide the DAC control signals to couple the thermometer capacitor to the high reference voltage and couple the one or more binary capacitors and all lower significance capacitors of the DAC to the low reference voltage. In a further aspect, the SAR circuitry is configured to, during calibration, for each thermometer capacitor, perform successive-approximation on the comparison output of the comparator to obtain the calibration value for the thermometer capacitor. In a further aspect, the ADC is configured to, during the sample phase, charge the first and second inputs of the comparator to a common mode voltage, and prior to commencing the comparison phase, release the first and second inputs of the comparator. In yet another aspect of the embodiment, the calibration circuitry is configured to, during calibration, for each binary capacitor: during a sample phase, provide DAC control signals to the DAC to charge the binary capacitor by coupling the binary capacitor to the low reference voltage and coupling all lower significance capacitors of the DAC to the high reference voltage; and during a comparison phase, provide the DAC control signals to the DAC to couple the binary capacitor to the high reference voltage and couple all lower significance capacitors of the DAC to the low reference voltage. In yet another aspect of the embodiment, each bit of the uncalibrated digital representation is based on a corresponding value of the comparison output.

In another embodiment, in an analog-to-digital converter (ADC), a method includes providing an analog input voltage to a split-capacitor digital-to-analog converter (DAC) within the ADC, wherein the DAC includes a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs; performing a comparison using an output of the DAC to provide a comparison output; performing a successive-approximation on the comparison output to provide an uncalibrated digital value which represents an input voltage to the DAC; obtaining a calibration value corresponding to each binary capacitor and each thermometer capacitor of the MSBs sub-DAC. The obtaining the calibration value corresponding to each thermometer capacitor includes, for each thermometer capacitor: during a sample phase, charging the thermometer capacitor by coupling the thermometer capacitor to the low reference voltage and coupling all lower significant capacitors the high reference voltage; during a comparison phase, coupling the thermometer capacitor to the high reference voltage and coupling the one or more binary capacitors and all lower significance capacitors of the DAC to the low reference voltage; and performing successive-approximation on the output of the comparator to obtain the calibration value for the thermometer capacitor; and using one or more calibration values to adjust the uncalibrated digital value to obtain a calibrated digital representation of the input voltage, wherein the one or more calibration values are selected based on the value of MSBs of the uncalibrated digital value. In one aspect of the another embodiment, the obtaining a calibration value corresponding to each binary capacitor and each thermometer capacitor of the MSBs sub-DAC further includes for each thermometer capacitor, during the sample phase, charging the first and second inputs of the comparator to a common mode voltage, and, prior to commencing the comparison phase, releasing the first and second inputs. In another aspect, the obtaining a calibration value corresponding to each binary capacitor includes, for each binary capacitor: during a sample phase, charging the binary capacitor by coupling the binary capacitor to the low reference voltage and coupling all lower significance capacitors of the DAC to the high reference voltage; during a comparison phase, coupling the binary capacitor to the high reference voltage and coupling all lower significance capacitors of the DAC to the low reference voltage; and performing successive-approximation on the output of the comparator to obtain the calibration value for the thermometer capacitor. In yet another aspect, the method further includes storing each calibration value. In yet another aspect, the method further includes storing sums of selected calibration values.

In yet another embodiment, in an analog-to-digital converter (ADC), a method includes: providing an analog input voltage to a split-capacitor digital-to-analog converter (DAC) within the ADC, wherein the DAC includes a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs; performing a comparison using an output of the DAC to provide a comparison output; performing a successive-approximation on the comparison output to provide an uncalibrated digital value which represents an input voltage to the DAC; obtaining a calibration value corresponding to each binary capacitor and each thermometer capacitor of the MSBs sub-DAC; and using one or more calibration values to adjust the uncalibrated digital value to obtain a calibrated digital representation of the input voltage, wherein the one or more calibration values are selected based on the value of MSBs of the uncalibrated digital value. In the yet another embodiment, when the value of the MSBs of the uncalibrated digital value is greater than 0, the method further includes subtracting at least N times the calibration value corresponding the least significant binary capacitor of the one or more binary capacitors, wherein N is an integer greater than 0, and subtracting the calibration value corresponding to the least significant thermometer capacitor of the one or more thermometer capacitors when the value of the MSBs of the uncalibrated signal is greater than one less than 2 raised to a number of binary capacitors of the one or more binary capacitors.

What is claimed is:

1. An analog-to-digital converter (ADC) comprising:
a split-capacitor digital-to-analog converter (DAC) having a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs, and coupled to receive an analog input voltage, a high reference voltage, and a low reference voltage, and to provide an output voltage, wherein the high reference voltage is greater than the low reference voltage;
a comparator having a first input coupled to receive the output voltage of the DAC, a second input, and a comparison output based on a difference in voltage between the first input and the second input;
successive-approximation-register (SAR) circuitry having an input coupled to receive the comparison output, and an output to provide an uncalibrated digital value corresponding to an uncalibrated digital representation of the input voltage; and
calibration circuitry coupled to receive the uncalibrated digital value and configured to apply one or more calibration values to the uncalibrated digital value to obtain a calibrated digital value corresponding to a calibrated digital representation of the input voltage, wherein the calibration values are selected based on the value of MSBs of the uncalibrated digital value.

2. The ADC of claim 1, wherein the calibration circuitry is configured to obtain a calibration value corresponding to each binary capacitor and each thermometer capacitor of the MSBs sub-DAC.

3. The ADC of claim 2, wherein the calibration circuitry is configured to obtain a calibration value, for each thermometer capacitor of the one or more thermometers capacitors, by individually comparing a capacitance of the thermometer capacitor to a sum of all capacitances of all binary capacitors and all capacitors of the LSBs sub-DAC and the termination capacitor.

4. The ADC of claim 3, wherein the calibration circuitry is configured to obtain a corresponding calibration value, for each binary capacitor, by comparing a capacitance of the binary capacitor to a sum of capacitances of all capacitors of lesser significant bits than the binary capacitor, including all capacitors of the LSBs sub-DAC, and the termination capacitor.

5. The ADC of claim 4, wherein the calibration circuitry is configured to apply the one or more calibration values to the uncalibrated digital value when the value of the MSBs of the uncalibrated digital value is greater than 0.

6. The ADC of claim 5, wherein the calibration circuitry is configured to apply the one or more calibration values to the uncalibrated digital value by subtracting at least N times the calibration value corresponding to the least significant binary capacitor of the one or more binary capacitors when the value of the MSBs of the uncalibrated digital value is greater than 0, wherein N is an integer greater than 0.

7. The ADC of claim 6, wherein the calibration circuitry is configured to apply the one or more calibration values to the uncalibrated digital value by also subtracting the calibration value corresponding to the least significant thermometer capacitor of the one or more thermometer capacitors when the value of the MSBs of the uncalibrated signal is greater than one less than 2 raised to a number of binary capacitors of the one or more binary capacitors.

8. The ADC of claim 4, wherein the calibration circuitry is configured to store each calibration value.

9. The ADC of claim 4, wherein the calibration circuitry is configured to store sums of selected calibration values.

10. The ADC of claim 1, wherein the calibration circuitry is configured to, during calibration, for each thermometer capacitor:
during a sample phase, provide DAC control signals to the DAC to charge the thermometer capacitor by coupling the thermometer capacitor to the low reference voltage and coupling all lower significant capacitors the high reference voltage; and
during a comparison phase, provide the DAC control signals to couple the thermometer capacitor to the high reference voltage and couple the one or more binary capacitors and all lower significance capacitors of the DAC to the low reference voltage.

11. The ADC of claim 10, wherein the SAR circuitry is configured to, during calibration, for each thermometer capacitor, perform successive-approximation on the comparison output of the comparator to obtain the calibration value for the thermometer capacitor.

12. The ADC of claim 11, wherein the ADC is configured to, during the sample phase, charge the first and second inputs of the comparator to a common mode voltage, and prior to commencing the comparison phase, release the first and second inputs of the comparator.

13. The ADC of claim 1, wherein the calibration circuitry is configured to, during calibration, for each binary capacitor:
during a sample phase, provide DAC control signals to the DAC to charge the binary capacitor by coupling the binary capacitor to the low reference voltage and coupling all lower significance capacitors of the DAC to the high reference voltage; and
during a comparison phase, provide the DAC control signals to the DAC to couple the binary capacitor to the high reference voltage and couple all lower significance capacitors of the DAC to the low reference voltage.

14. The ADC of claim 1, wherein each bit of the uncalibrated digital representation is based on a corresponding value of the comparison output.

15. In an analog-to-digital converter (ADC), a method comprising:
providing an analog input voltage to a split-capacitor digital-to-analog converter (DAC) within the ADC, wherein the DAC includes a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs;
performing a comparison using an output of the DAC to provide a comparison output;
performing a successive-approximation on the comparison output to provide an uncalibrated digital value which represents an input voltage to the DAC;
obtaining a calibration value corresponding to each binary capacitor and each thermometer capacitor of the MSBs sub-DAC, wherein the obtaining the calibration value corresponding to each thermometer capacitor comprises:
for each thermometer capacitor:
during a sample phase, charging the thermometer capacitor by coupling the thermometer capacitor to the low reference voltage and coupling all lower significant capacitors the high reference voltage;

during a comparison phase, coupling the thermometer capacitor to the high reference voltage and coupling the one or more binary capacitors and all lower significance capacitors of the DAC to the low reference voltage; and performing successive-approximation on the output of the comparator to obtain the calibration value for the thermometer capacitor; and using one or more calibration values to adjust the uncalibrated digital value to obtain a calibrated digital representation of the input voltage, wherein the one or more calibration values are selected based on the value of MSBs of the uncalibrated digital value.

16. The method of claim 15, wherein the obtaining a calibration value corresponding to each binary capacitor and each thermometer capacitor of the MSBs sub-DAC further comprises:

for each thermometer capacitor, during the sample phase, charging the first and second inputs of the comparator to a common mode voltage, and, prior to commencing the comparison phase, releasing the first and second inputs.

17. The method of claim 15, wherein the obtaining a calibration value corresponding to each binary capacitor comprises:

for each binary capacitor:
during a sample phase, charging the binary capacitor by coupling the binary capacitor to the low reference voltage and coupling all lower significance capacitors of the DAC to the high reference voltage;

during a comparison phase, coupling the binary capacitor to the high reference voltage and coupling all lower significance capacitors of the DAC to the low reference voltage; and performing successive-approximation on the output of the comparator to obtain the calibration value for the thermometer capacitor.

18. The method of claim 15, further comprising storing each calibration value.

19. The method of claim 15, further comprising storing sums of selected calibration values.

20. In an analog-to-digital converter (ADC), a method comprising:

providing an analog input voltage to a split-capacitor digital-to-analog converter (DAC) within the ADC, wherein the DAC includes a Most Significant Bits (MSBs) sub-DAC with one or more MSBs encoded with one or more binary capacitors and one or more MSBs encoded with one or more thermometer capacitors, a Least Significant Bits (LSBs) sub-DAC, a termination capacitor coupled to the LSBs sub-DAC, and a scaling capacitor coupled between the LSBs and MSBs sub-DACs;

performing a comparison using an output of the DAC to provide a comparison output;

performing a successive-approximation on the comparison output to provide an uncalibrated digital value which represents an input voltage to the DAC;

obtaining a calibration value corresponding to each binary capacitor and each thermometer capacitor of the MSBs sub-DAC; and using one or more calibration values to adjust the uncalibrated digital value to obtain a calibrated digital representation of the input voltage, wherein the one or more calibration values are selected based on the value of MSBs of the uncalibrated digital value, wherein, when the value of the MSBs of the uncalibrated digital value is greater than 0:

subtracting at least N times the calibration value corresponding the least significant binary capacitor of the one or more binary capacitors, wherein N is an integer greater than 0, and subtracting the calibration value corresponding to the least significant thermometer capacitor of the one or more thermometer capacitors when the value of the MSBs of the uncalibrated signal is greater than one less than 2 raised to a number of binary capacitors of the one or more binary capacitors.

* * * * *